(12) United States Patent
Kejariwal et al.

(10) Patent No.: US 6,937,046 B1
(45) Date of Patent: Aug. 30, 2005

(54) NON-INVASIVE, LOW PIN COUNT TEST CIRCUITS AND METHODS

(75) Inventors: Murari Kejariwal, Austin, TX (US); Prasad Ammisetti, Austin, TX (US); Axel Thomsen, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 503 days.

(21) Appl. No.: 10/027,187

(22) Filed: Dec. 20, 2001

(51) Int. Cl.[7] ............................................. G01R 31/02

(52) U.S. Cl. .................... 324/763; 324/158.1

(58) Field of Search ................. 324/765, 763, 324/158.1, 760; 702/85, 104, 118, 64; 714/25, 714/734

(56) References Cited

U.S. PATENT DOCUMENTS

| | | | | |
|---|---|---|---|---|
| RE34,295 E | * | 6/1993 | Shibuya et al. | 341/133 |
| 5,559,454 A | * | 9/1996 | Schneider | 327/4 |
| 5,999,008 A | * | 12/1999 | Currin et al. | 324/765 |
| 6,320,275 B1 | * | 11/2001 | Okamoto et al. | 307/10.1 |
| 6,327,545 B1 | * | 12/2001 | Browen et al. | 702/85 |
| 6,420,880 B1 | * | 7/2002 | Miller | 324/537 |

* cited by examiner

*Primary Examiner*—Vinh Nguyen
*Assistant Examiner*—Tung X. Nguyen
(74) *Attorney, Agent, or Firm*—Thompson & Knight LLP; James J. Murphy

(57) ABSTRACT

A method of testing an integrated circuit including the steps of observing a selected parameter at a selected test mode to detect an error. The current to the integrated circuit is stepped from a reference level by selected amount.

6 Claims, 4 Drawing Sheets

US 6,937,046 B1

NON-INVASIVE, LOW PIN COUNT TEST CIRCUITS AND METHODS

FIELD OF INVENTION

The present invention relates in general to integrated circuits and in particular, to non-invasive, low pin-count test circuits and methods.

BACKGROUND OF INVENTION

Testing integrated circuits typically involves evaluation of important parameters at various functional levels under differing operating conditions, such as temperature. For example, the overall operation of the chip may be tested in addition to the specific testing of particularly critical circuits or circuit blocks. This is especially important with respects to complex integrated circuits where the overall device functionality may fall within specifications but the functioning of one or more internal circuit blocks is nonetheless only marginal.

The actual implementation of an efficient test protocol for a given chip is a non-trivial task subject to many variables. Among other things, if on-chip test circuitry is to be used, that test circuitry must be non-invasive. In other words, the operation of the test circuitry should not in itself alter any of the critical operating parameters of the device or disturb a critical signal path. Additionally, depending on packaging limitations, it is not always practical to provide sufficient pins for observing all the internal circuits requiring test. Further, notwithstanding the problem of access, some means must be provided to trigger the internal circuitry test mode. Finally, but of no less importance, some decision must be made as to which parameters and nodes are to be tested.

Given the importance of testing at various functional levels of an integrated circuit, improved testing techniques are required. These techniques should be non-invasive, neither disturbing critical signal paths nor dictating undue changes in the physical configuration device or packaging. They should be flexibly amenable to the testing of various nodes and parameters on the integrated circuit in a time-efficient fashion.

SUMMARY OF INVENTION

According to the principles of the present invention, methods and circuits are disclosed for the non-invasive testing of internal blocks of integrated circuits. According to one embodiment of these principles, a method is disclosed which includes steps of observing a selected parameter at a selected test node, detecting an error in response to the observation. Current to the integrated circuit stepped from a reference level by a selected current step representing the detected error.

The principles of the present invention have several advantages over the prior art. Among other things, by stepping the power supply current to the integrated circuit, more information can be transmitted in a non-invasive manner without the need for additional dedicated test pins. A number of different parameters can be tested and the results output while modulating the power supply current, including offset voltages. With respects to chopper stabilized amplifiers, an offset can be introduced into the amplifier input and the offset voltage at the output is observed. Moreover, the stepping of the power supply current can be used to time the counting of an oscillator output to verify proper oscillator operation.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–8 of the drawings, in which like numbers designate like parts.

Figure 1:
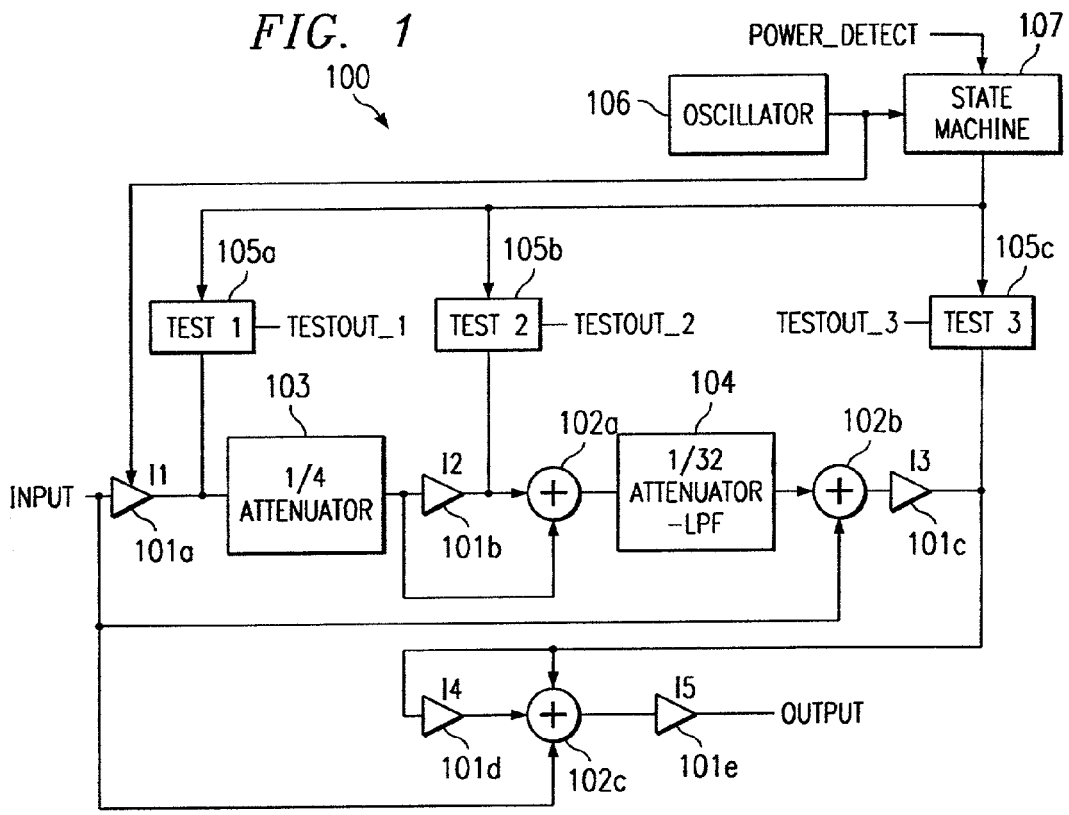
FIG. 1 is a functional block diagram of a multipath feedforward operational amplifier embodying the present inventive principles.

FIG. 1 is a functional block diagram of a feed-forward operational amplifier 100, fabricated on a single chip, and embodying the principles of the present invention. (Opamp 100 is only one of a number of possible applications of these principles, which are particularly useful in instances where testing of deeply embedded circuits is required and/or the number of pins or pads available for parameter observation is limited).

Opamp 100 is based on five (5) integrator stages 101$a,e$. In the preferred embodiment, integrator stage I1 is chopper-stabilized, as discussed in further detail below. A set of summers 102$a,c$ implement the feed-forward function. The primary data path also includes ¼ attenuator 103 and ¹⁄₃₂ attenuator—low pass filter (LPF) 104.

According to the present inventive principles, three test blocks 105$a,c$ are provided to monitor three selected nodes representing corresponding state variables in opamp 100. In the preferred embodiment, the data paths through opamp 100 are differential and test blocks 105$a,c$ monitor the differential voltage between the conductor pairs, although other parameters can also be monitored. It should be noted that, electrical parameters such as voltage and current can also be monitored in embodiments using single-ended data paths. In the present example, when differential voltages exceeding a predetermined level are deemed to be an error and the supply current is modulated as a flag.

Timing and control of the chopper stabilization of integrator I1 and test block is effectuated with an on-chip oscillator 106. A state machine 107 generates the test control signals described in detail below.

Figure 2:
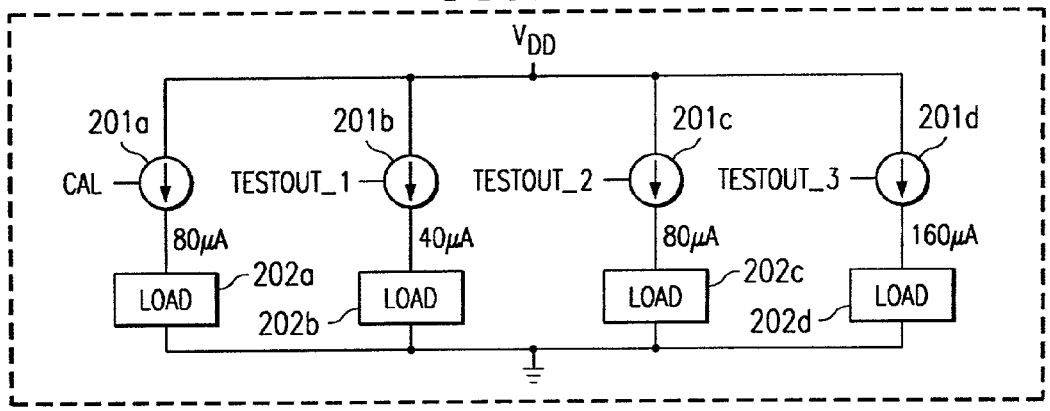
FIG. 2 is a functional block diagram of one exemplary circuit for stepping the supply current to the operational amplifier of FIG. 1 in response to selected test conditions.
Figure 3:
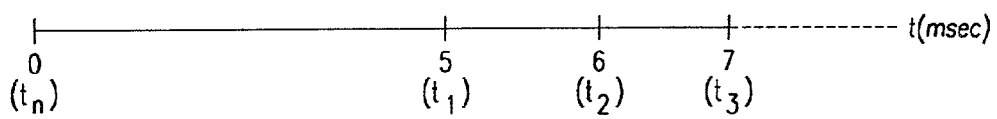
FIG. 3 is a timing diagram illustrating the typical operating regimes of the operational amplifier of FIG. 1.

A high-level functional block diagram of current modulation circuitry 200 which steps the supply current during test mode operations is shown as FIG. 2. Conceptually, current modulation circuitry 200 comprises a plurality of parallel binary-weighted current sources 201a,d and associated loads 202a,d. Current source 201a is activated during the test mode calibration phase by the control signal CAL while current sources 201b,d are activated by the output signals from test blocks 105a, TESTMODE1–TESTMODE3. Current sources 201a–d are deactivated in the normal mode, i.e., at the end of the test mode phase.

In the preferred embodiment, test mode operations are observed by monitoring power supply current. For this embodiment, the test mode phase is approximately 7 msec in duration and is divided into the time intervals shown in the timing diagram of FIG. 3. During the first interval, of about 5 msec (i.e. between times $t_0$ and $t_1$, the internal circuits of op-amp 200 and the external testing instruments are allowed to stabilize to a steady state. This is followed by a second, calibration interval of approximately 2 msec. During the first 1 msec of the calibration interval, (i.e. between time $t_1$ and $t_2$.), the power supply current is stepped to a calibration current level. Then, in the last 1 msec of the calibration interval, (i.e. between time $t_2$ and $t_3$.), the power supply current is stepped as an indication of possible error locations.

Figure 4A:
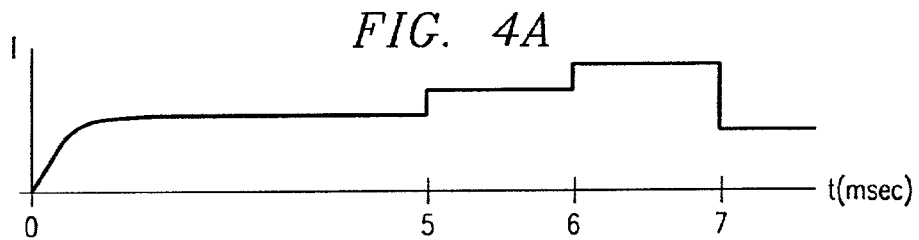
FIG. 4A illustrates an exemplary power current profile illustrating the modulation of the power supply current during the test phase shown in FIG. 3.
Figure 4B:
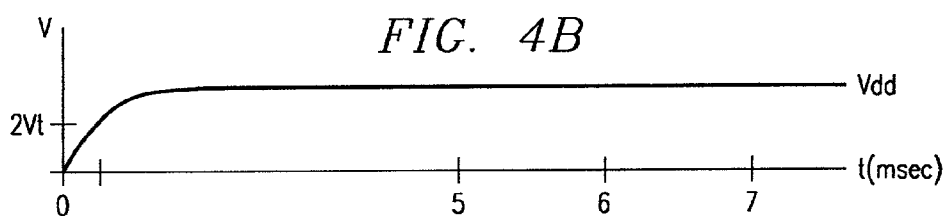
FIGS. 4B–4F are voltage versus time diagrams of exemplary timing signals controlling the operating regimes of FIG. 3 as generated by the state machine of FIG. 1.
Figure 4C:
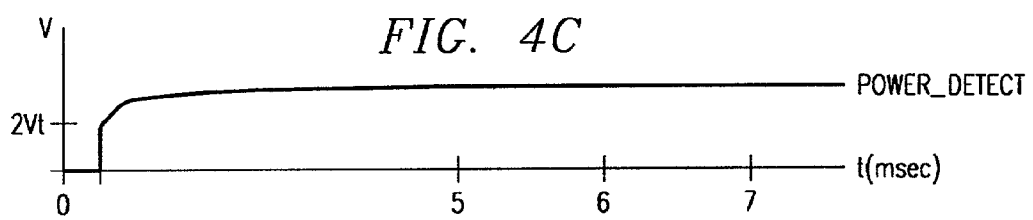
Figure 4D:
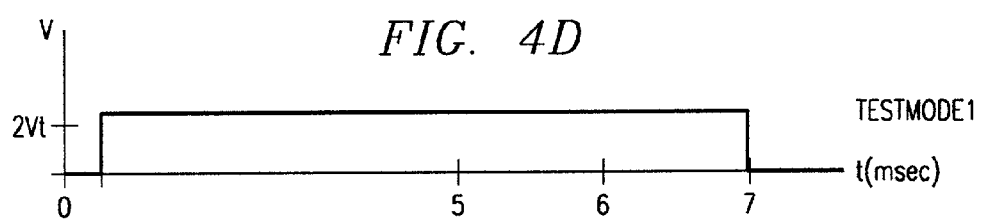
Figure 4E:
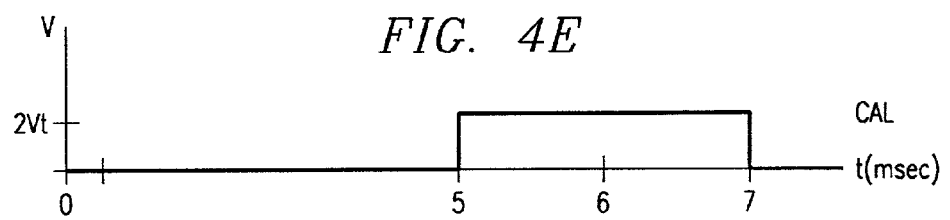
Figure 4F:
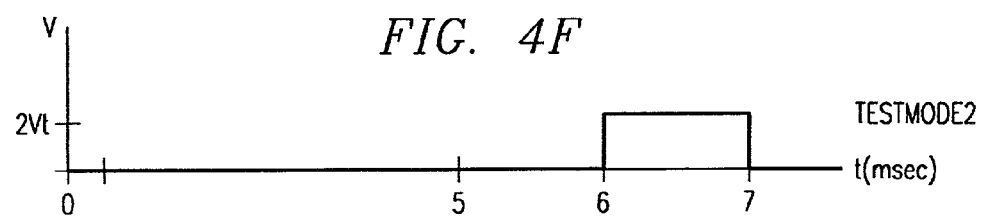
Figure 5:
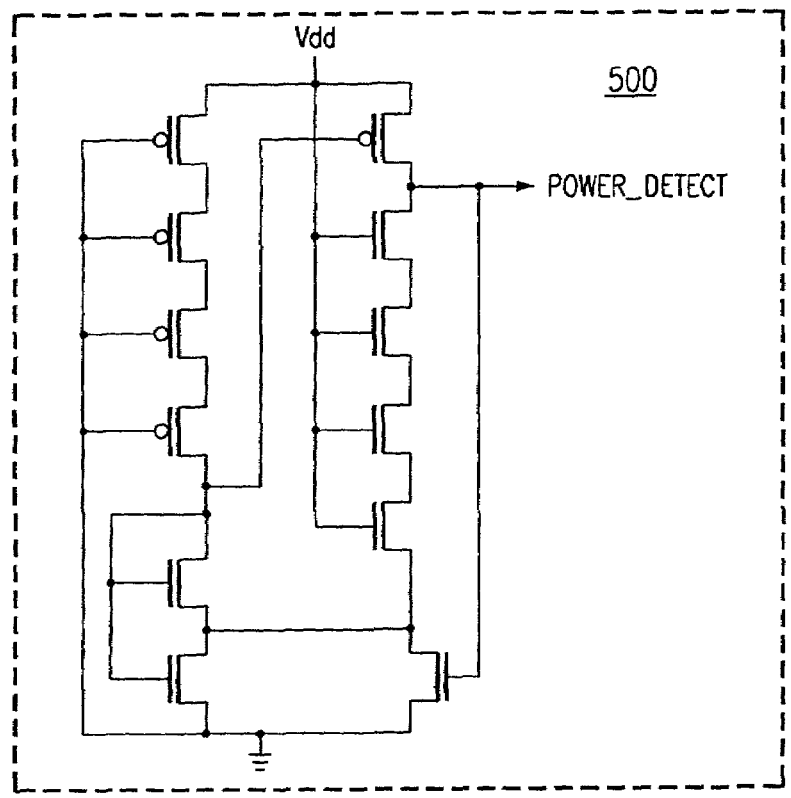
FIG. 5 is an electrical schematic diagram of an exemplary power detect circuit suitable for generating the power detect control signal of FIG. 4B.

An exemplary power current profile during test mode is shown in FIG. 4A. The associated timing and control signals are shown in FIGS. 4B–4F, where FIG. 4B shows the power supply voltage profile, FIG. 4B shows the signal Power_Detect ramping-up with the power supply, and FIGS. 4C–4F illustrate exemplary state machine—generated timing signals activating test blocks 105a,c and calibration current source 201a. Specifically, state machine output signal TESTMODE1 indicates that the test mode is active, CAL times the 2 msec calibration interval and TESTMODE2 times the final 1 msec during which detected errors are identified.

During the first 5 msec interval the current is higher than nominal since the test mode circuitry is running and therefore requiring power. This is followed by a step of 80 μamps of calibration current for 2 msec. As shown in FIG. 2, the power supply current stepping is preferrably done by turning-on one or more parallel current sources 201. The calibration current is selected to provide a reference against which the error current steps are measured; if the calibration current source load varies from the specified nominal for a given device due to fabrication process variations, the error step current source loads on the same chip should vary similarly from their nominal values such that the absolute relationships between steps remains essentially the same.

In the last 1 msec of the test period, detected errors, if any, are flagged by an additional current step above the calibration level. In the present three test node example, binary weighted currents of 0, 40, 80 and 160 μamps are used to indicate the results, although other current magnitudes could be used depending on the particular application. The error step is the sum of the individual error currents representing each of the detected errors. For example, if two errors are detected, one represented nominally by 40 μamps and the other nominally by 160 μamps, then the total current step above the calibration level will be nominally 200 μamps. From the external observation point, a measured step of 200 μamps can be uniquely decoded as 40 and 160 μamp parts, representing the designated errors. If no error is detected, then the profile is substantially flat after the 80 μamp calibration step. After the test mode is complete, the power supply current returns to its nominal state current requirement for normal mode functions.

Inducing the test mode when no extra pins are available for this purpose is another problem addressed by the inventive principles. There are a number of ways that this can be done. Preferably, a state machine is used which generates the control signals CAL, TESTMODE1 and TESTMODE2. The state machine is activated by power-detect circuitry 500 shown in FIG. 5. Power-detect circuitry 500 generates a pulse when the power supply voltage exceeds a selected threshold, preferably 2vt of the transistors or approximately 1.4 volts.

While there are numerous parameters which can be tested in accordance with the inventive principles, the three parameters being tested are:

(1) the differential voltages at three test nodes; (2) oscillator frequency; and (3) chopper operation.

In the illustrated embodiment, test blocks 105a,b preferably test the offset voltage at various points along the differential data path. One test block 105 is shown in further detail in FIG. 6. (In this embodiment, the same voltage detection circuit is used for each test node, although the comparator limits may differ).

Test circuitry 105 comprises a difference amplifier including a differential pair of transistors 601a,b responding to the input signals $V_{IN-}$ and $V_{IN+}$ respectively and operating from a current source 603. Corresponding transistors 602a,b are biased such that they operate in the triode (non-saturation) region when transistors 601a,b have no differential input voltage (i.e. $V_{IN-}=V_{IN+}$). The common nodes represent the outputs TESTOUTM and TESTOUTP which have a low voltage swing of between 0.2 to 0.5 volts. The outputs of the difference amplifier TESTOUTM and TESTOUTP, are input into a logic-OR gate 604 which generates TESTOUTX, where x is between 1 and 3 and represents the corresponding test block (node) 105a,c. A voltage difference between $V_{IN-}$ and $V_{IN+}$ divides the current from current source unevenly between transistors 601a and 601b. The magnitude of the voltage difference at the gates of transistors 601a and 601b determines the direction and magnitude of the current split. In particular, if the difference between $V_{IN-}$ and $V_{IN+}$ is sufficiently large, then most of the current is sunk through either transistor 601a or 601b and the corresponding voltage of TESTOUTP or TESTOUTM increases enough to cause OR gate 604 to generate the ultimate output signal TESTOUTX indicating an excessive imbalance at the node being tested.

In the preferred embodiment, each differential voltage detector is tuned by changing the current sources 603 and/or the sizes of transistors 601a,b.

Figure 6:
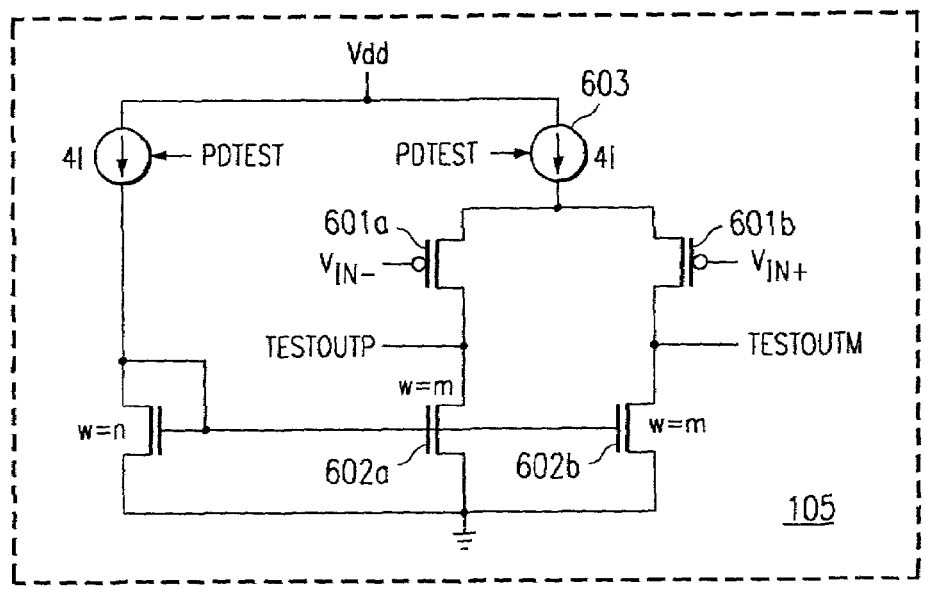
FIG. 6 is an electrical schematic of a selected one of the test circuit blocks shown in FIG. 1.
Figure 6:
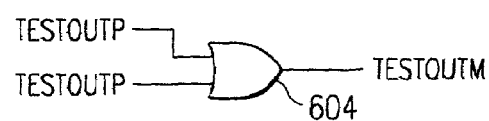

Advantageously, the differential voltage detectors shown in FIG. 6 sense node voltages without interfering with signal transmission through the tested nodes. Additionally, the preferred circuitry is turned-off (with the PDTEST signal) when the normal mode of operation begins.

The oscillator frequency is derived by a time measurement over the last 2 msec interval of the test mode. Specifically, the current steps at times t1 and t3 are used to define the 2 msec period over which counter 107 or similar circuit is used to count periods of the oscillator. The oscillator frequency can be derived from the time measurement between t1 and t3.

Figure 7:
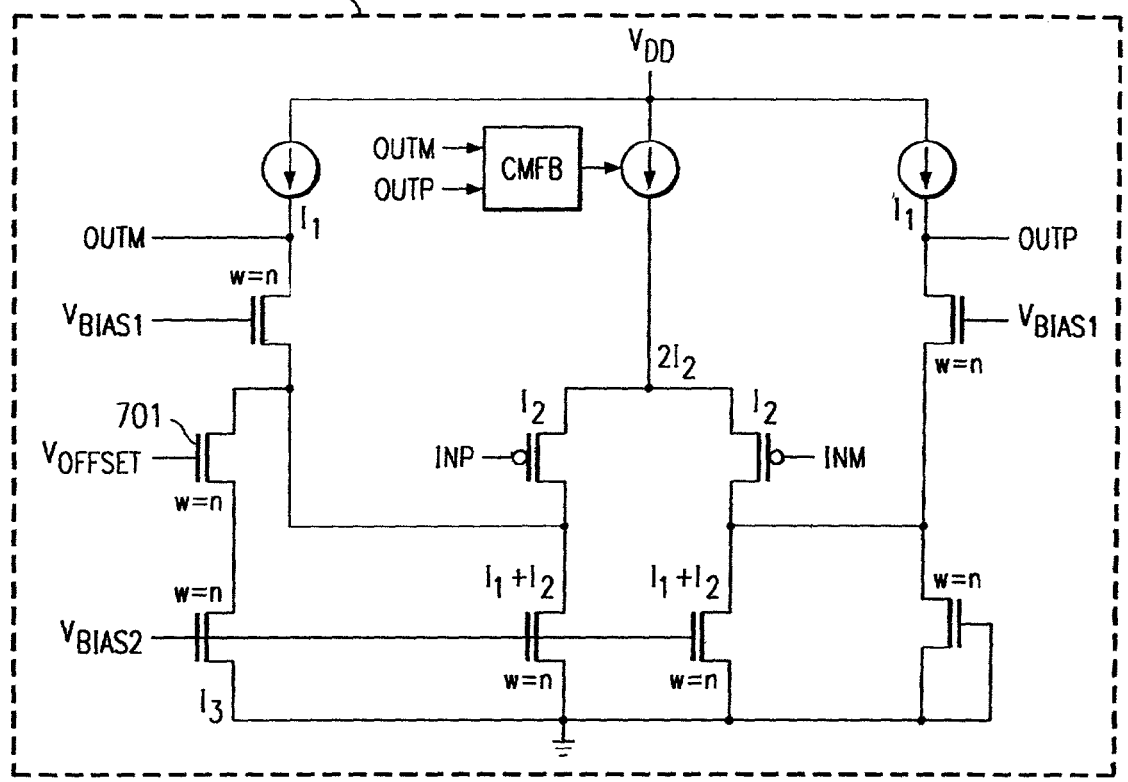
FIG. 7 is an electrical schematic diagram of an exemplary chopper-stabilized integrator suitable for use in selected ones of the integrator stages of FIG. 1.

In the preferred embodiment of op-amp 100, integrator 101a (I1) is based on a chopper-stabilized amplifier as shown in FIG. 7, where CMFB represent the common mode feedback. Chopper-stabilized amplifiers normally chop their internal offsets. In other words, if a chopper-stabilized amplifier is working well, it should remove its internal offset. Hence, to test integrator I1 an offset $V_{offset}$ is introduced at one of the integrator differential inputs pair transistor. If no difference is detected between the output offset voltage either during the 7 msec test mode or normal operation, then the chopper is functioning correctly.

Figure 8A:
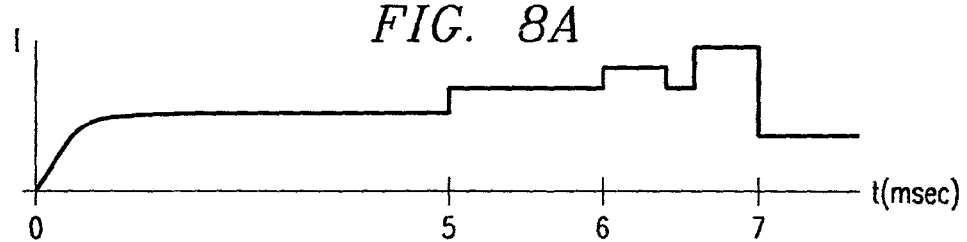
FIGS. 8A and 8B are current profiles illustrating alternate methods of modulating the power supply current in response to selected test conditions.
Figure 8B:
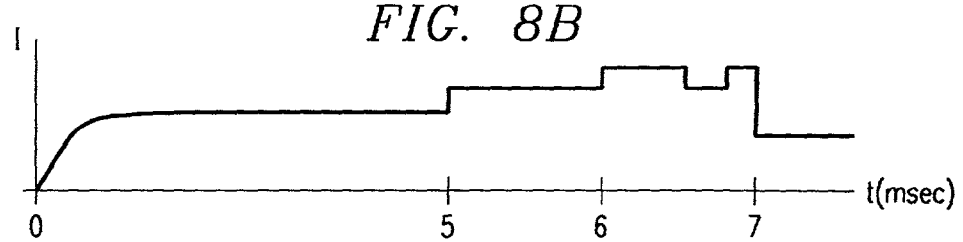

It should be recognized that there are a number of alternate ways in which supply current can be modulated, two of which are shown in FIGS. 8A and 8B. Generally, the number of current levels needed to encode all possible error combinations is $2^n$ where n is the number of state variables to be monitored. In other words, when n increases the required levels increase exponentially, thus limiting n to 3 or 4.

In one alternate time-multiplexed encoding, n is divided into smaller numbers and then each number is encoded. For example if n is 4, the division can be made into two sequences and then each sequence coded as described above. The typically current waveform may look as shown in FIG. 8A.

In another embodiment, pulse width modulation can be used to modulate power supply current with the code. Advantageously, this technique can be used to monitor a large number of state variables is short testmode times. If the number of state variables to be monitored is large, it can also be divided into smaller groups and a pulse width modulated sequence can be used for each number as shown in FIG. 8B.

Additionally, there are alternate ways in which the test mode can be induced. In any event, the conditions or mechanism which induces self test mode should not be normally present or occurring during normal operation of the op amp. Moreover, the self test should last for a short time, in this example it lasts for 7 milliseconds. In one alternate embodiment therefore, both the differential input pins (INPUT, FIG. 1) are connected momentarily to 0.3 volts below the lowest power supply voltage to the chip. Internally, a simple comparator circuit senses the voltage and it triggers the state machine as described above. (This voltage should be lower than the lowest power supply voltage but higher than −0.7 volts at which voltage protection diodes at input pins start conducting and should not be asserted during normal operation).

A variation of this technique is to keep the input voltage lower for a specified time period. This makes accidental inducing of test mode more difficult.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method of testing an integrated circuit comprising the steps of:
    observing a selected parameter at a selected test node;
    detecting an error at the selected best node in responses to said step of observing; and
    stepping a current to the integrated circuit from a reference level by a selected current stop representing the detected error.

2. The method of claim 1 and further comprising the steps of:
    observing a selected parameter at a second selected test node;
    detecting a second error in response to said step of observing the selected parameter at the second selected test node; and
    stepping the current to the integrated circuit by a second selected step representing the second error, the current being a sum of the selected step and the second selected current step and representing the error and the second error.

3. The method of claim 1 and further comprising the steps of:
    allowing the current to settle to an initial level after initiation of a test mode; and
    stepping the current to the reference level from the initial level.

4. The method of claim 3 wherein the selected parameter comprises a differential voltage.

5. The method of claim 2 wherein the selected step and the second selected step are binary weighted current steps.

6. The method of claim 1 and further comprising the step of initiating a test mode in response to power-up of the integrated circuit.

* * * * *